United States Patent [19]
Yamasaki

[11] Patent Number: 6,021,504
[45] Date of Patent: Feb. 1, 2000

[54] HIGH-SPEED INTERNAL CLOCK SYNCHRONIZING METHOD AND CIRCUIT

[75] Inventor: Takashi Yamasaki, Tokyo, Japan

[73] Assignee: Mitsubishi Denki Kabushiki Kaisha, Tokyo, Japan

[21] Appl. No.: 09/097,671

[22] Filed: Jun. 16, 1998

[51] Int. Cl.⁷ ..................................................... G06F 1/12
[52] U.S. Cl. ............................................................ 713/400
[58] Field of Search ..................................... 713/400, 501, 713/503, 601; 331/1 R, 18, 55; 375/354, 356; 327/141, 155, 159, 162

[56] References Cited

U.S. PATENT DOCUMENTS

| | | | |
|---|---|---|---|
| 4,813,305 | 3/1989 | Redig et al. | 331/1 R X |
| 5,565,816 | 10/1996 | Coteus | 331/18 X |
| 5,717,353 | 2/1998 | Fujimoto | 327/276 |
| 5,790,608 | 8/1998 | Benayoun et al. | 375/356 |
| 5,859,549 | 1/1999 | Shuholm | 327/151 |
| 5,889,829 | 3/1999 | Chiao et al. | 375/376 |

*Primary Examiner*—Thomas M. Heckler
*Attorney, Agent, or Firm*—Burns, Doane, Swecker & Mathis, LLP

[57] ABSTRACT

An internal clock synchronizing circuit capable of solving a problem involved in a conventional high speed microcomputer system in that it takes a long time to establish clock synchronization between system component circuits of the microcomputer system. The internal clock synchronizing circuit includes a clock generator for generating an internal clock signal by dividing an original clock signal; a clock comparator for comparing the internal clock signal with a reference clock signal; a compared result holding circuit for holding, in synchronism with the original clock signal, a compared result signal output from the clock comparator; and a clock switching circuit for switching supply of the original clock signal to the clock generator in response to the compared result signal held in the compared result holding circuit.

10 Claims, 4 Drawing Sheets

HIGH-SPEED INTERNAL CLOCK SYNCHRONIZING METHOD AND CIRCUIT

BACKGROUND OF THE INVENTION

1. Field of the Invention

The present invention relates to an internal clock synchronizing method and circuit for synchronizing the internal clock signals used in a plurality of system component circuits constituting a system.

2. Description of Related Art

It is often necessary for a conventional system constructed by combining a plurality of system component circuits to synchronize their internal clock signals with each other. This is because the system component circuits are operating in synchronism with each other, and hence if their internal clock signals are brought out of synchronization, they cannot achieve smooth data exchange between them, which may lead to an erroneous operation.

Furthermore, to keep with the present trend to lower power consumption, the system component circuits are often provided with a function of reducing current consumption by halting their internal clock signals while they are inactive. This makes it necessary for these circuits to synchronize their internal clock signals again when they resume their operation.

Moreover, although clock generators of the system component circuits are conventionally synchronized with each other through an external reset or interrupt, the trend of devices toward a faster operating speed makes it difficult to establish accurate synchronization depending on the external reset timings.

One of such conventional internal clock synchronizing circuits is disclosed in Japanese patent application laid-open No. 62-118417/1987. It discloses a system consisting of multiple microprocessors (system component circuits), each of which generates its own divided clock signal (internal clock signal) by dividing a common original clock signal, and operates in synchronism with the divided clock. A phase comparator compares a pair of the divided clock signals generated by a pair of the microprocessors, and outputs a signal proportional to a phase difference between them. An integrator integrates the signal, and a comparator makes a decision whether the integral of the signal exceeds a reference value or not, and outputs a signal if the integral exceeds the reference value. Thus, if a decision is made that the phase difference occurs between the pair of the microprocessors, the supply of the original clock signal to one of the microprocessors is suspended until the phase difference is eliminated. Thus, the division of the original clock signal is suspended during that period. When the phase difference is cancelled out, the supply of the original clock signal is resumed along with the phase comparison.

Although the conventional internal clock synchronizing circuit with such an arrangement can achieve the synchronization of the internal clock signals (divided clock signals) between the system component circuits (microprocessors), it has a drawback that it takes a rather long time to establish the synchronization because it integrates the phase compared result, and then compares the integral results by the comparator to suspend the original clock signal. This present a problem of delaying the response in today's high speed microprocessors.

SUMMARY OF THE INVENTION

The present invention is implemented to solve the foregoing problem. It is therefore an object of the present invention to provide an internal clock synchronizing method capable of quickly synchronizing the internal clock signals by carrying out the sampling of the phase compared result of the internal clock signals at the edges of the original clock signal.

Another object of the present invention is to provide an internal clock synchronizing circuit capable of achieving the synchronization of the internal clock signals quickly with a simple circuit configuration.

According to a first aspect of the present invention, there is provided an internal clock synchronizing method for synchronizing internal clock signals of a plurality of system component circuits constituting a system, each of the internal clock signals being generated by one of the system component circuits by dividing an original clock signal, the internal clock synchronizing method comprising the steps of: adopting one of the plurality of system component circuits as a reference system component circuit that produces its internal clock signal as a reference clock signal, adopting one or more remaining system component circuits of the plurality of system component circuits as slave system component circuits, and supplying the slave system component circuits with the reference clock signal; obtaining a compared result in each of the slave system component circuits by comparing its internal clock signal with the reference clock signal by means of sampling using the original clock signal; and suspending dividing of the original clock signal temporarily in each of the system component circuits if the compared result indicates that a phase difference is present between the reference clock signal and the internal clock signal.

Here, the internal clock synchronizing method may further comprise the step of determining in each of the system component circuits whether it carries out synchronization of its internal clock signal with the reference clock signal or not according to a synchronizing control bit.

The internal clock synchronizing method may further comprise the step of notifying a controller in each of the system component circuits through a flag whether that system component circuit is carrying out synchronization of its internal clock signal with the reference clock signal or not.

The internal clock synchronizing method may further comprise the step of outputting, from each of the system component circuits, a monitor signal indicating whether that system component circuit is carrying out synchronization of its internal clock signal with the reference clock signal or not.

The internal clock synchronizing method may further comprising the step of increasing, when carrying out in each of the system component circuits synchronization of its internal clock signal with the reference clock signal, a dividing ratio of the original clock signal for a fixed interval to reduce a frequency of its internal clock signal.

According to a second aspect of the present invention, there is provided an internal clock synchronizing circuit comprising: a clock generator for generating an internal clock signal by dividing an original clock signal; a clock comparing circuit for comparing the internal clock signal generated by the clock generator with a reference clock signal to produce a compared result signal; a compared result holding circuit for holding, in synchronism with the original clock signal, the compared result signal output from the clock comparing circuit; and a clock switching circuit for controlling, in response to the compared result signal held in the compared result holding circuit, whether to supply the clock generator with the original clock signal or not.

Here, the internal clock synchronizing circuit may further comprise: a control register to which a synchronizing control bit is set that indicates whether to carried out or not a synchronizing operation for synchronizing the internal clock signal with the reference clock signal; and a signal switching circuit for controlling, in response to the synchronizing control bit set in the control register, whether to supply or not the clock switching circuit with the compared result signal held in the compared result holding circuit.

The internal clock synchronizing circuit may further comprise a flag bit indicative of the compared result signal held in the compared result holding circuit.

The internal clock synchronizing circuit may further comprise a monitor terminal for outputting the compared result held in the compared result holding circuit to an outside of a system component circuit that constitutes a system and includes the internal clock synchronizing circuit.

The clock generator, receiving the synchronizing control bit set in the control register, may increase a dividing ratio of the original clock signal to reduce a frequency of its internal clock signal, when the synchronizing control bit indicates that synchronization of the internal clock signal with the reference clock signal is to be carried out.

DETAILED DESCRIPTION OF THE PREFERRED EMBODIMENTS

The invention will now be described with reference to the accompanying drawings.

EMBODIMENT 1

Figure 1:
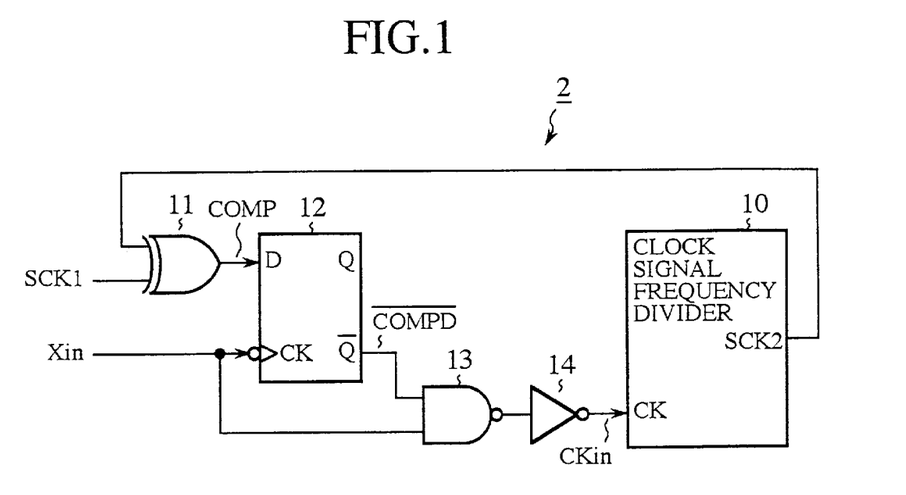
FIG. 1 is a block diagram showing an embodiment 1 of an internal clock synchronizing circuit in accordance with the present invention.
Figure 2A:
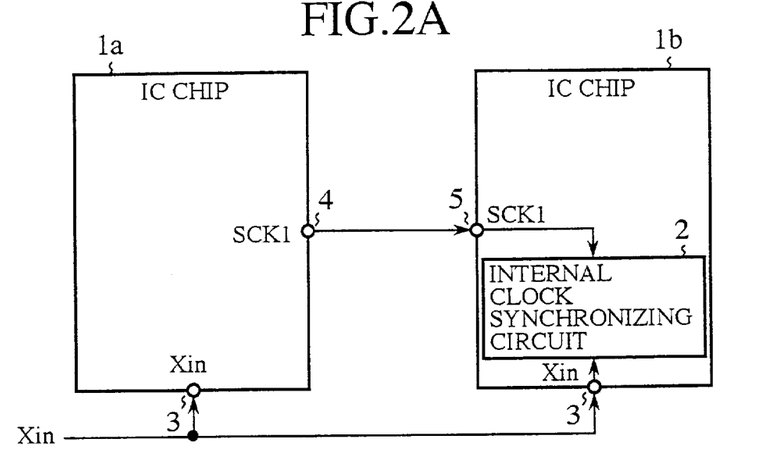
FIGS. 2A and 2B are block diagrams each showing a system to which the internal clock synchronizing method in accordance with the present invention is applied.
Figure 2B:
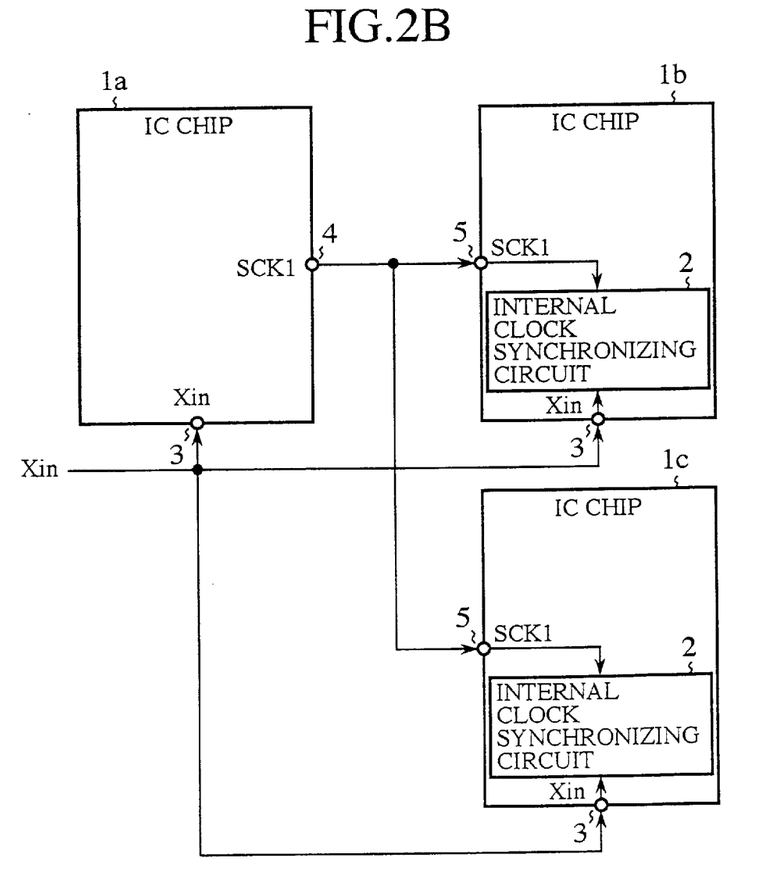

FIG. 1 is a block diagram showing an embodiment 1 of an internal clock synchronizing circuit in accordance with the present invention, and FIGS. 2A and 2B are block diagrams each showing a configuration of a system to which an internal clock synchronizing method in accordance with the present invention is applied. Here, FIG. 2A shows a system comprising two system component circuits, and FIG. 2B shows a system including three system component circuits.

In FIGS. 2A and 2B, reference numerals 1a, 1b and 1c each designate an IC (integrated circuit) chip as a system component circuit constituting the systems, and reference numerals 2's each designate an internal clock synchronizing circuit which is placed in the IC chips 1b and 1c, and has a configuration as shown in FIG. 1. Here, the IC chip 1a functions as a master system component circuit that divides an original clock signal Xin of the system to generate an internal clock signal SCK1, and outputs the internal clock signal SCK1 as a reference clock signal. On the other hand, the remaining IC chips 1b and 1c each functions as a slave system component circuit which includes the internal clock synchronizing circuit 2 that generates an internal clock signal SCK2 by dividing the original clock signal Xin, and synchronizes it with the internal clock signal SCK1 fed from the IC chip 1a. The reference numerals 3's each designate a clock terminal for inputting the original clock signal Xin to the IC chips 1a–1c; 4's each designate a synchronization output terminal for outputting from the master IC chips 1a the internal clock signal SCK1 as the reference clock signal; and 5's each designate a synchronization input terminal for supplying the slave IC chips 1b and 1c with the internal clock signal SCK1 from the IC chip 1a as the reference clock signal.

In FIG. 1, the reference numeral 10 designates a clock signal frequency divider for generating the internal clock signal SCK2 by dividing the original clock signal Xin of the system. The reference numeral 11 designates an exclusive OR circuit 11 that compares the internal clock signal SCK2 generated by the clock signal frequency divider 10 with the reference clock signal SCK1 fed from the master IC chip 1a, and outputs a compared result signal COMP. The reference numeral 12 designates a D flip-flop for holding the compared result signal COMP fed from the exclusive OR circuit 11 in synchronism with the original clock signal Xin. The reference numeral 13 designates an NAND circuit for carrying out control whether to input or not the original clock signal Xin to the clock signal frequency divider 10 according to a compared result signal COMPD held in the D flip-flop 12, or more precisely, according to an inverted compared result signal—COMPD output from the—Q terminal of the D flip-flop 12, where the sign "–" indicates negation. The reference numeral 14 designates an inverter that inverts the output signal of the NAND circuit 13 to generate a clock signal CKin, and supplies it to the CK terminal of the clock signal frequency divider 10.

Next, the operation of the present embodiment 1 will be described.

Figure 3A:
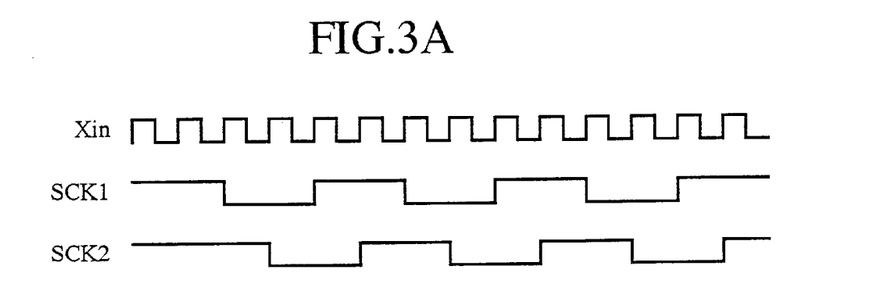
FIGS. 3A and 3B are timing charts each illustrating the operation of the embodiment 1.
Figure 3B:
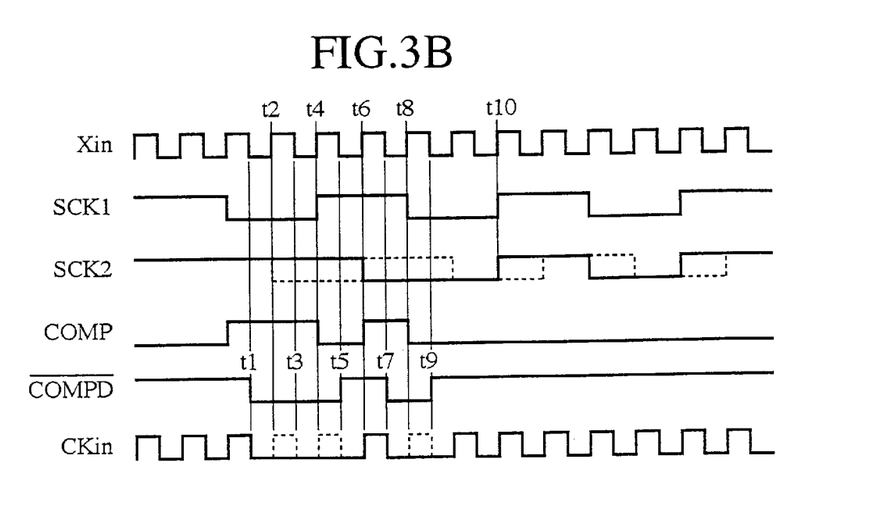

FIGS. 3A and 3B are timing charts showing the operation of the internal clock synchronizing circuit 2 as shown in FIG. 1, wherein FIG. 3A illustrates the operation when the synchronizing operation is not carried out that synchronizing the internal clock signal SCK2 of the slave IC chip 1b with the internal clock signal SCK1 of the master IC chip 1a, and FIG. 3B illustrates the operation when it is carried out. In FIGS. 3A and 3B, the internal clock signals SCK1 and SCK2 of the IC chips 1a and 1b are generated by quartering the original clock signal Xin.

The system component circuits 1a and 1b of the system as shown in FIG. 2A use the same original clock signal Xin, and generate the internal clock signals SCK1 and SCK2 by dividing the original clock signal Xin by four. The state as shown in FIG. 3A, in which the internal clock signals SCK1 and SCK2 are not synchronized with each other, although they are each synchronized with the original clock signal Xin, can take place when one of the IC chips 1a and 1b, for example, IC chip 1b temporarily suspends the internal clock signal SCK2 by executing a stop command or the like, and resumes it.

To synchronize the internal clock signals SCK1 and SCK2, one of them must be adopted as the reference. Here, the internal clock signal SCK1 of the IC chip a*a* is chosen as the reference clock signal, so that the internal clock signal SCK2 of the IC chip 1*b* is synchronized with it. Thus, the IC chip 1*a* outputs its internal clock signal SCK1 from the synchronization output terminal 4 as the reference clock signal, and the IC chip 1*b* receives it at the synchronization input terminal 5, and supplies it to the internal clock synchronizing circuit 2. Then, it synchronizes, to the reference internal clock signal SCK1, the internal clock signal SCK2 generated by dividing the original clock signal Xin by the clock signal frequency divider 10 therein.

The operation of the present embodiment 1 will be described in more detail with reference to FIG. 3B.

The internal clock synchronizing circuit 2 in the IC chip 1*b* generates its internal clock signal SCK2 by dividing the original clock signal Xin through the clock signal frequency divider 10. The internal clock signal SCK2 is input to the exclusive OR circuit 11 to be compared with the reference clock signal SCK1 fed from the IC chip 1*a*. It is assumed here for convenience of description that transitions of the reference clock signal SCK1 and internal clock signal SCK2 take place at the rising edges of the original clock signal Xin. The exclusive OR circuit 11 outputs the compared result signal COMP that assumes a low level (denoted as "L" from now on) if the internal clock signal SCK2 agrees with the reference clock signal SCK1, and a high level (denoted as "H" below) if they disagree.

Receiving the compared result signal COMP at its D input terminal, the D flip-flop 12 samples it at the falling edges of the original clock signal Xin fed to its CK terminal, holds it, and outputs the held compared result signal COMPD from its Q terminal, and its inverted signal —COMPD form its—Q terminal. The falling edges of the original clock signal Xin are timings at which the reference clock signal SCK1 and internal clock signal SCK2 are most stable. The inverted signal—COMPD output from the—Q output terminal of the D flip-flop 12 is "H" when the reference clock signal SCK1 agrees with the internal clock signal SCK2, whereas it is "L" when they disagree, and is supplied to the NAND circuit 13.

When the internal clock signal SCK2 is being generated as illustrated by broken lines in FIG. 3B, and the inverted compared result signal—COMPD becomes "L", the NAND circuit 13 blocks the original clock signal Xin. Thus, when the inverted compared result signal—COMPD becomes "L" at time t1, the NAND circuit 13 blocks the original clock signal Xin at time t2, and hence the inverter 14 suspends to supply the clock signal CKin to the CK terminal of the clock signal frequency divider 10. Since the clock signals SCK1 and SCK2 also disagree at the next falling edge of the original clock signal Xin at time t3, the input of the next clock signal CKin at time t4 is also suspended. Therefore, as denoted by the solid lines in FIG. 3B, the transition of the internal clock signal SCK2 to "L" is delayed by two clock periods of the original clock signal Xin from time t2 to time t6 as compared with the conventional one as denoted by the broken-line. Although they agree at the next falling edge of the original clock signal Xin at time t5, and hence the clock signal CKin is supplied to the clock signal frequency divider 10 at time t6, they disagree again at the next falling edge at time t7, and the supply of the clock signal CKin to the clock signal frequency divider 10 is suspended again at time t8.

Repeating such operation finally brings the internal clock signal SCK2 into synchronization with the reference clock signal SCK1 as shown by the solid line in the latter half of FIG. 3B. Once the internal clock signal SCK2 has been synchronized with the reference clock signal SCK1 at time t10, they continues to agree with each other from then on. Thus, the inverted compared result signal—COMPD output from the—Q terminal of the D flip-flop 12 continues to be "H" so that the original clock signal Xin is supplied from the inverter 14 to the CK terminal of the clock signal frequency divider 10 as the clock signal CKin without being blocked by the NAND circuit 13.

Although in the foregoing description the reference clock signal SCK1 and internal clock signal SCK2 are compared, and the compared result is held in the D flip-flop 12 by sampling it, this is not essential. For example, the reference clock signal SCK1 and internal clock signal SCK2 can be held separately by sampling them each in synchronism with the original clock signal Xin, and then the held contents can be compared to produce the compared result signal for controlling the clock switching circuit, providing the same effect as the foregoing embodiment.

Furthermore, although the clock signal frequency divider 10 quarters the clock signal CKin in the foregoing description, it can divide it by two or eight. Moreover, although the foregoing description is provided in connection with the system that comprises two IC chips 1*a* and 1*b* as shown in FIG. 2A, the synchronization of the internal clocks can be achieved in the system comprising three IC chips 1*a*–1*c* as shown in FIG. 2B, or in a system comprising four or more IC chips, by using the internal clock signal of the IC chip 1*a* as the reference clock signal.

According to the present embodiment 1, the internal clock signal SCK2 is compared with the reference clock signal SCK1, and the compared result signal is held in the D flip-flop 12 in synchronism with the original clock signal Xin, so that the supply of the original clock signal Xin to the clock signal frequency divider 10 is controlled by the compared result signal held in the D flip-flop 12. As a result, with the use of the edges of the original clock signal Xin, the internal clock signal SCK2 can be synchronized with the reference clock signal SCK1 without delay in response to the result of the phase comparison. This offers an advantage of implementing the internal clock synchronizing circuit 2 with a simple configuration.

EMBODIMENT 2

Figure 4:
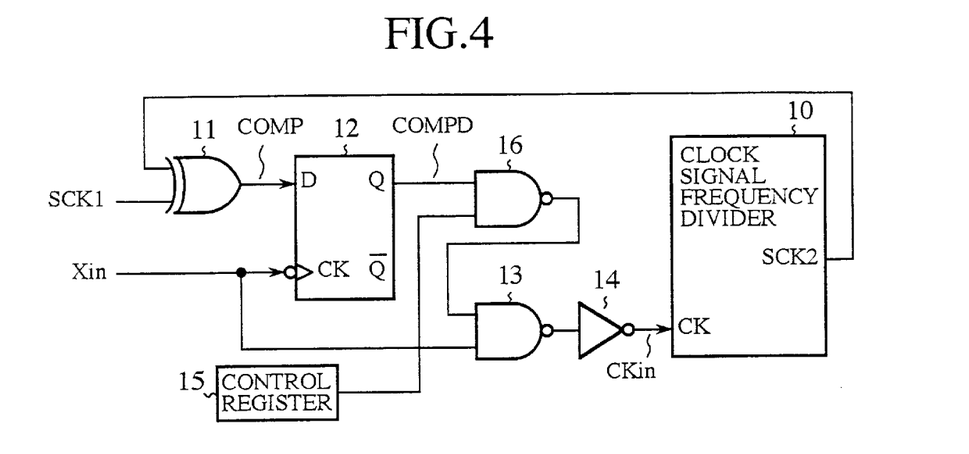
FIG. 4 is a block diagram showing an embodiment 2 of the internal clock synchronizing circuit in accordance with the present invention.

Although the synchronization of the internal clock signals is carried out without exception in the foregoing embodiment 1, it can be modified to be performed as needed. FIG. 4 is a block diagram showing an embodiment 2 of such an internal clock synchronizing circuit in accordance with the present invention. In FIG. 4, the same reference numerals as those of FIG. 1 designate the corresponding portions, and the description thereof is omitted here.

In FIG. 4, the reference numeral 15 designates a control register in which a synchronizing control bit is set to indicate whether or not the internal clock signal SCK2 generated by the clock signal frequency divider 10 should be synchronized with the reference clock signal SCK1. The reference numeral 16 designates an NAND circuit for controlling, in response to the synchronizing control bit set in the control register 15, whether to supply or not the NAND circuit 13 with the compared result signal COMPD fed from the Q terminal of the D flip-flop 12.

Next, the operation of the present embodiment 2 will be described.

It should be noticed that the synchronizing becomes unnecessary if the IC chip comprising the internal clock synchronizing circuit 2 uses, as its internal clock signal, the original clock signal Xin of the system without dividing it. Accordingly, determining by software whether to carry out the synchronization or not makes it possible to eliminate unnecessary operation and to save consumed current.

More specifically, to carry out the synchronization, the synchronizing control bit in the control register 15 is set at "H", whereas to suspend the synchronization, it is set at "L". Receiving the synchronizing control bit from the control register 15, the NAND circuit 16 maintains its output at "H" as long as the synchronizing control bit is "L", thereby blocking the compared result signal COMPD fed from the Q output terminal of the D flip-flop 12. Thus, the synchronizing control bit, which is set at "L" when suspending the synchronization, causes the output of the NAND circuit 13 to be maintained at "H". This enables the original clock signal Xin to be supplied through the inverter 14 to the CK terminal of the clock signal frequency divider 10 as the clock signal CKin. On the other hand, to carry out the synchronization, the synchronizing control bit is set at "H". In this case, the NAND circuit 16 supplies a first input terminal of the NAND circuit 13 with the inverted signal of the compared result signal COMPD, so that the internal clock signal SCK2 is synchronized with the reference clock signal SCK1 through the operation like that of the embodiment 1.

If the entire IC chips 1a, 1b, 1c, ... constituting the system have the foregoing function, and if the synchronizing control bit of the IC chip 1a is set at "L" (ineffective) and the synchronizing control bits of all the other IC chips are set at "H" (effective), the synchronization based on the IC chip 1a becomes possible. To place the IC chip 1b as the reference of the synchronization, it is enough to set the synchronizing control bit of the IC chip 1b ineffective, and the synchronizing control bits of all the remaining IC chips effective.

Thus, in the present embodiment 2, the synchronizing control bit set in the control register 15 determines whether to perform the synchronizing operation of the internal clock signal or not. This offers advantages of enabling the software to decide whether to perform the synchronizing operation or not, enabling the internal clock synchronizing circuits to avoid unnecessary operations, the current consumption to be saved, and the reference IC chips to be freely set by software by providing the entire IC chips with this function.

EMBODIMENT 3

Figure 5:
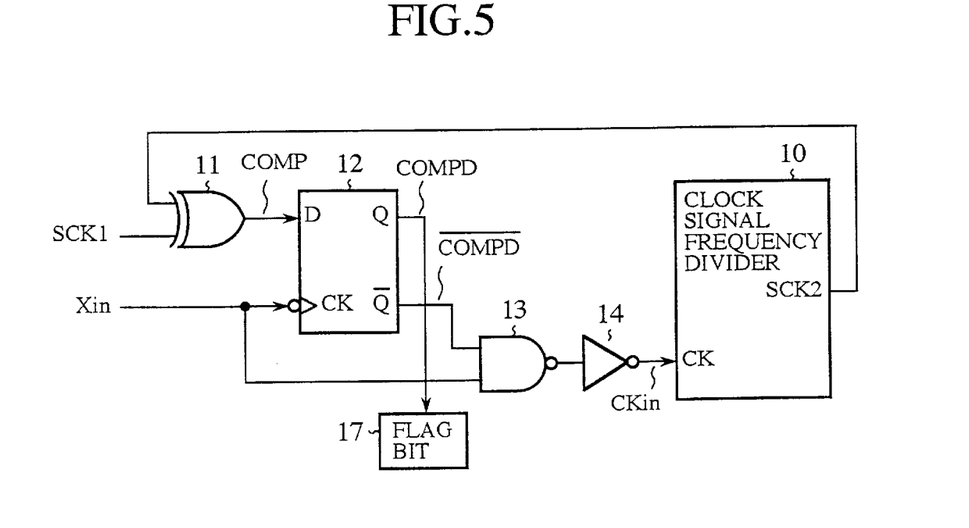
FIG. 5 is a block diagram showing an embodiment 3 of the internal clock synchronizing circuit in accordance with the present invention.

Although the foregoing embodiment 1 does not comprise an indicator for showing whether the internal clock synchronizing circuit is carrying out the synchronizing operation or not, it can be provided. FIG. 5 is a block diagram showing an embodiment 3 of such an internal clock synchronizing circuit in accordance with the present invention, in which the corresponding portions to those of FIG. 1 are designated by the same reference numerals. In FIG. 5, the reference numeral 17 designates a flag bit for indicating whether the internal clock synchronizing circuit is carrying out the synchronizing operation or not.

Next, the operation of the present embodiment 3 will be described.

Since the synchronizing operation for synchronizing the internal clock signal SCK2 to the reference clock signal SCK1 is the same as that of the embodiment 1, the description thereof is omitted here. The D flip-flop 12 holds the compared result signal COMP fed from the exclusive OR circuit 11 in synchronism with the original clock signal Xin, and the compared result signal COMPD output from its Q terminal is supplied to the flag bit 17 to be shown. Specifically, the flag bit 17 is placed at "L" after the synchronizing operation has been completed in the internal clock synchronizing circuit, whereas it is placed at "H" while the synchronizing operation is being carried out. The controller like a CPU (central processing unit) of the IC chip 1b refers to the flag bit 17, and if it is "L", the controller can take any steps because the internal clock signal SCK2 has been synchronized with the internal clock signal SCK1 of the IC chip 1a. On the contrary, if the flag bit 17 is "H", it indicates that the synchronization is being carried out. In this case, the controller must delay such an operation that will bring about an error if carried out before the synchronization is established.

According to the present embodiment 3, since the flag bit 17 indicates the content of the D flip-flop 12, the controller of the IC chip can recognize whether the synchronizing operation is being carried out or not by referring to the flag bit 17. This offers an advantage of being able to achieve more accurate processings because the processings that would bring about an error if performed before the synchronization can be avoided while the flag bit 17 indicates that the synchronizing operation is proceeding.

EMBODIMENT 4

Figure 6:
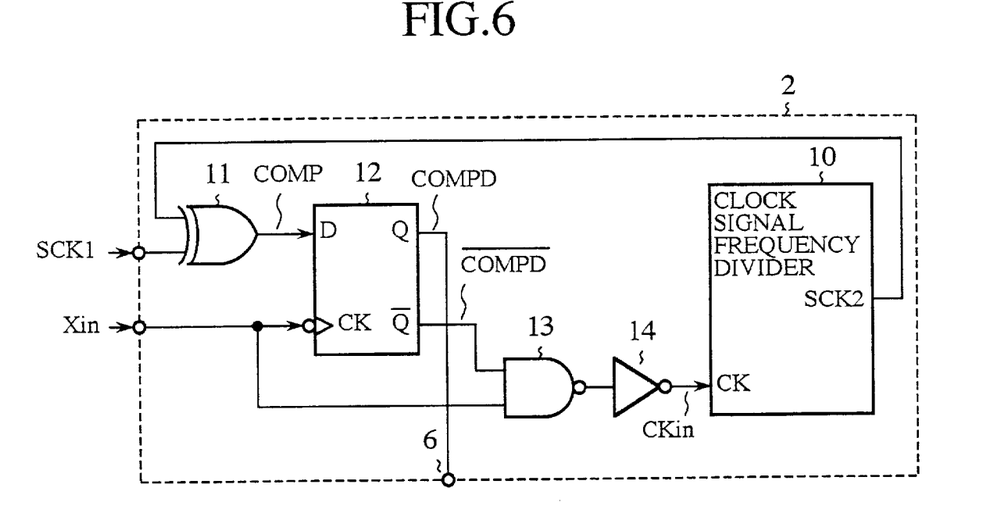
FIG. 6 is a block diagram showing an embodiment 4 of the internal clock synchronizing circuit in accordance with the present invention.

Although the foregoing embodiment 3 has the flag bit 17 indicate whether the synchronizing operation is proceeding or not so that the controller within the same IC chip can obtain this information, the same information can be output if the number of terminals of the IC chip can afford to do this. This enables other IC chips to recognize whether it is carrying out the synchronizing operation or not through the terminal. FIG. 6 is a block diagram showing such an embodiment 4 of the internal clock synchronizing circuit in accordance with the present invention, in which the corresponding portions to those of FIG. 1 are designated by the same reference numerals, and the description thereof is omitted here. In FIG. 6, the reference numeral 6 designates a monitor terminal for producing to the outside of the IC chip a signal indicating whether the internal clock synchronizing circuit 2 of the IC chip is carrying out the synchronizing operation or not.

Next, the operation of the present embodiment 4 will be described.

Since the synchronizing operation for synchronizing the internal clock signal SCK2 with the reference clock signal SCK1 is the same as that of the embodiment 1, the description thereof is omitted here. The D flip-flop 12 holds the compared result signal COMP fed from the exclusive OR circuit 11, and supplies it to the monitor terminal 6 from its Q terminal as the compared result signal COMPD. Thus, the signal output from the monitor terminal 6 is "L" if the synchronizing operation has already been completed in the internal clock synchronizing circuit 2, whereas it is "H" if the synchronizing operation is proceeding. The remaining IC chip 1a receives the signal from the monitor terminal 6, and if the signal is "L", it can take any steps because the internal clock signal SCK2 has been synchronized with the reference clock signal SCK1 in the IC chip 1b. On the contrary, if the signal received from the monitor terminal 6 is "H", it indicates that the synchronization is proceeding in the IC chip 1b. In this case, the IC chip 1a must prolong such an operation that would bring about an error if carried out before the synchronization is established.

According to the present embodiment 4, since the monitor terminal 6 outputs the content of the D flip-flop 12, the other IC chip or chips can recognize whether the synchronizing operation is being carried out or not in that IC chip by receiving the signal from its monitor terminal 6. This offers an advantage of being able to achieve more accurate processings because the processings that would bring about an error if performed before the synchronization can be avoided while the synchronizing operation is proceeding in the IC chip. In addition, using the signal output from the monitor terminal 6 as a busy signal offers an advantage of enabling bus access to be controlled directly.

EMBODIMENT 5

Figure 7:
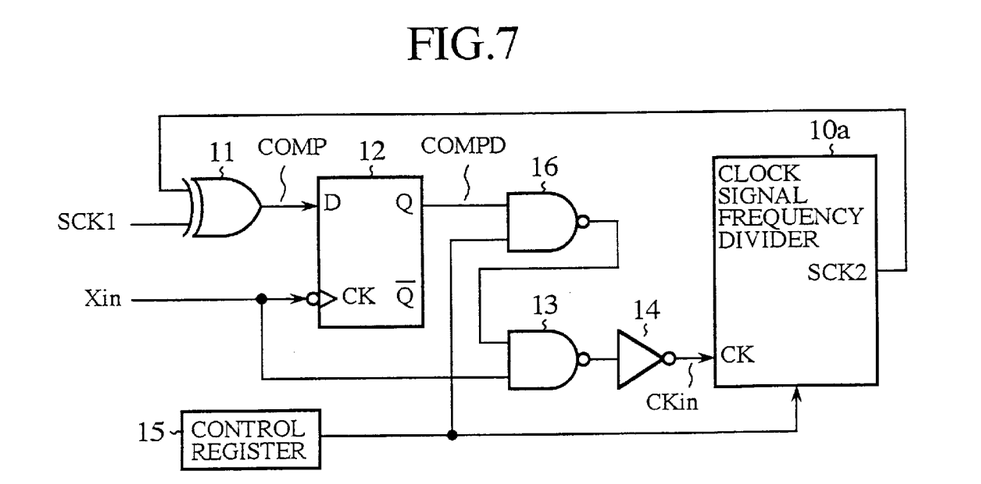
FIG. 7 is a block diagram showing an embodiment 5 of the internal clock synchronizing circuit in accordance with the present invention.

Although the dividing ratio of the original clock signal Xin by the clock signal frequency divider 10 is fixed in the foregoing embodiments, it can be increased for a fixed interval during the synchronizing operation to reduce the frequency of the internal clock signal to achieve the synchronizing operation more positively. FIG. 7 is a block diagram showing such an embodiment 5 of the internal clock synchronizing circuit in accordance with the present invention, in which the corresponding portions to those of FIG. 4 are designated by the same reference numerals, and the description thereof is omitted here. In FIG. 7, the reference numeral 10a designates a clock signal frequency divider which differs from the clock signal frequency divider 10 as shown in FIGS. 1 and 4–6 in that it receives the synchronizing control bit from the control register 15, and increases the dividing ratio of the original clock signal Xin if the synchronizing control bit indicates the synchronizing operation so that it outputs the internal clock signal SCK2 with a reduced frequency.

Next, the operation of the present embodiment 5 will be described.

Since the synchronizing operation for synchronizing the internal clock signal SCK2 to the reference clock signal SCK1 is the same to that of the embodiment 3, the description thereof is omitted here. With an increase in the frequency of the internal clock signal SCK2 output from the clock signal frequency divider 10a, it sometimes becomes difficult for the D flip-flop to achieve, by the original clock signal Xin, the sampling of the compared result signal COMP produced as a result of comparing the internal clock signal SCK2 with the reference clock signal SCK1. In view of this, the clock signal frequency divider 10a, receiving the synchronizing control bit from the control register 15, increases the dividing ratio to a maximum while the synchronizing control bit is "H", that is, while it indicates the synchronizing operation. This will considerably reduce the frequency of the internal clock signal SCK2 output from the clock signal frequency divider 10a, which enables the sampling of the compared result signal COMP by the D flip-flop 12 using the original clock signal Xin to be achieved with ease. After the synchronization at the lower frequency has been established, the synchronizing control bit of the control register 15 is returned to the "L". This enables the dividing ratio to return to its normal value, thereby generating the internal clock signal SCK2 at the higher normal frequency.

According to the present embodiment 5, the dividing ratio of the clock signal frequency divider 10a is increased in the fixed period during the synchronizing operation to reduce the frequency of the internal clock signal SCK2 to be compared with the reference clock signal SCK1. This enables the sampling of the compared result signal COMP using the original clock signal Xin to be performed more easily, and hence enables the synchronization of the internal clock signal SCK2 with the reference clock signal SCK1 to be achieved more positively.

What is claimed is:

1. An internal clock synchronizing method for synchronizing internal clock signals of a plurality of system component circuits constituting a system, each of the internal clock signals being generated by one of the system component circuits by dividing an original clock signal, said internal clock synchronizing method comprising the steps of:

adopting one of said plurality of system component circuits as a reference system component circuit that produces its internal clock signal as a reference clock signal, adopting one or more remaining system component circuits of said plurality of system component circuits as slave system component circuits, and supplying said slave system component circuits with the reference clock signal;

obtaining a compared result in each of said slave system component circuits by comparing its internal clock signal with the reference clock signal by means of sampling using the original clock signal; and suspending dividing of said original clock signal temporarily in each of said system component circuits if the compared result indicates that a phase difference is present between the reference clock signal and the internal clock signal.

2. The internal clock synchronizing method as claimed in claim 1, further comprising the step of determining in each of said system component circuits whether it carries out synchronization of its internal clock signal with the reference clock signal or not according to a synchronizing control bit.

3. The internal clock synchronizing method as claimed in claim 1, further comprising the step of notifying a controller in each of said system component circuits through a flag whether that system component circuit is carrying out synchronization of its internal clock signal with the reference clock signal or not.

4. The internal clock synchronizing method as claimed in claim 1, further comprising the step of outputting, from each of said system component circuits, a monitor signal indicating whether that system component circuit is carrying out synchronization of its internal clock signal with the reference clock signal or not.

5. The internal clock synchronizing method as claimed in claim 1, further comprising the step of increasing, when carrying out in each of said system component circuits synchronization of its internal clock signal with the reference clock signal, a dividing ratio of the original clock signal for a fixed interval to reduce a frequency of its internal clock signal.

6. An internal clock synchronizing circuit comprising:

a clock generator for generating an internal clock signal by dividing an original clock signal;

a clock comparing circuit for comparing the internal clock signal generated by said clock generator with a reference clock signal to produce a compared result signal;

a compared result holding circuit for holding, in synchronism with the original clock signal, the compared result signal output from said clock comparing circuit; and a clock switching circuit for controlling, in response to the compared result signal held in said compared result holding circuit, whether to supply said clock generator with the original clock signal or not.

7. The internal clock synchronizing circuit as claimed in claim 6, further comprising:

a control register to which a synchronizing control bit is set that indicates whether to carry out or not a synchronizing operation for synchronizing the internal clock signal with the reference clock signal; and a signal switching circuit for controlling, in response to the synchronizing control bit set in said control register, whether to supply or not the clock switching circuit with the compared result signal held in said compared result holding circuit.

8. The internal clock synchronizing circuit as claimed in claim 6, further comprising a flag bit indicative of the compared result signal held in said compared result holding circuit.

9. The internal clock synchronizing circuit as claimed in claim 6, further comprising a monitor terminal for outputting the compared result held in said compared result holding circuit to an outside of a system component circuit that constitutes a system and includes said internal clock synchronizing circuit.

10. The internal clock synchronizing circuit as claimed in claim 7, wherein said clock generator, receiving the synchronizing control bit set in said control register, increases a dividing ratio of the original clock signal to reduce a frequency of its internal clock signal, when the synchronizing control bit indicates that synchronization of the internal clock signal with the reference clock signal is to be carried out.

* * * * *

UNITED STATES PATENT AND TRADEMARK OFFICE
CERTIFICATE OF CORRECTION

PATENT NO. : 6,021,504
DATED : February 1, 2000
INVENTOR(S) : Takashi YAMASAKI

It is certified that error appears in the above-identified patent and that said Letters Patent is hereby corrected as shown below:

In Section [56], add   "Foreign Patent Documents"

"62-118417   5/1987  Japan"

Add Section "[30]  Foreign Application Priority Data

Jan. 19, 1998  [JP]  Japan.........10-007941"

Signed and Sealed this

First Day of May, 2001

Attest:

NICHOLAS P. GODICI

Attesting Officer             Acting Director of the United States Patent and Trademark Office